United States Patent [19]

Ansel

[11] Patent Number: 5,013,940
[45] Date of Patent: May 7, 1991

[54] MULTI STAGE SLEW CONTROL FOR AN IC OUTPUT CIRCUIT

[75] Inventor: George M. Ansel, Starkville, Miss.

[73] Assignee: Cypress Semiconductor Corporation, San Jose, Calif.

[21] Appl. No.: 431,479

[22] Filed: Nov. 3, 1989

[51] Int. Cl.[5] .................... H03K 17/16; H03K 17/687
[52] U.S. Cl. .................................. 307/473; 307/263; 307/443
[58] Field of Search ............... 307/473, 443, 450–453, 307/571–572, 591, 594, 263

[56] References Cited

U.S. PATENT DOCUMENTS

| 4,329,600 | 5/1982 | Stewart | 307/540 |
| 4,723,108 | 2/1988 | Murphy | 323/315 |
| 4,771,195 | 9/1988 | Stein | 307/572 |
| 4,800,298 | 1/1989 | Yu et al. | 307/451 |
| 4,859,870 | 10/1989 | Wong et al. | 307/263 |
| 4,877,978 | 10/1989 | Platt | 307/473 |

Primary Examiner—David Hudspeth
Assistant Examiner—Andrew Sanders
Attorney, Agent, or Firm—Blakely, Sokoloff, Taylor & Zafman

[57] ABSTRACT

The transient voltage spike generated by the distributed inductance of the packaging wires on an IC chip is reduced by slowing the on-to-off switching speed of the output transistors. The longer switching time provides a longer dt in the di/dt current through the wires during turn off. A two stage slew control circuit controls the initial stage and final stage of the slew period with an initial fast stage to advance the start of output transistor turn off and a slow stage for extending the turn off slew period during the final stage of the slew period.

27 Claims, 3 Drawing Sheets

MULTI STAGE SLEW CONTROL FOR AN IC OUTPUT CIRCUIT

TECHNICAL FIELD

This invention relates to slew control for the output circuit of an IC, and more particularly to a two stage, dual slope slew control for the output transistors.

BACKGROUND

Integrated circuit chips are mounted in a lead frame which connects to the circuit board by two rows of bottom pins. A tiny bonding wire extends from each output pad on the chip to an adjacent pad on the lead frame, and a lead frame wire extends from the adjacent pad to one of the bottom pins. These two packaging wires combined could be as long as 2.5 cm, and with a distributed inductance of over 15 nanohenries.

As the output transistors are switched on and off, di/dt transients are generated in the output current flowing through the packaging wires connecting the pad to the circuit board. A typical "di" in the output current to a 32 channel load on the circuit board might be 4 milliamperes per channel or 128 milliamperes. A typical on-off switching time for an output transistor is about 2 nanoseconds.

The magnitude of the voltage spike generated along the packaging wires between the chip power pad and the bottom pin would be about:

$$\begin{aligned} V_{spike} &= L\ (di/dt) \\ &= 15\ \text{nhenries}\ (128\ \text{milliamps}/1.5\ \text{nsec}) \\ &= 1.28\ \text{volts.} \end{aligned}$$

The minimum voltage required to effect a change of state on the input of a 5 volt MOS device is on the order of 0.8 volts. These voltage spikes are generated on the power rails by the output transistors as they are switching; and cause troublesome random events in the chip circuitry. The massive distributed inductance of the conducting leads on the circuit board do not contribute to the inductive spike because of the grounding plane layer buried within the circuit board.

U.S. Pat. No. 4,723,108 to Colin N. Murphy and Robert G. Pugh teaches using a constant current source in the high-to-low side of the pull-down inverter for reducing the slew rate of the pull-down transistor. The slew rate is regulated by a reference voltage to the gate of the constant current source. Extending the switching time "dt" by slowing the slew rate reduces the output di/dt resulting in a lower voltage spike into the Vss rail.

U.S. patent application Ser. No. 246,634, filed Sept. 19, 1988 by Paul E. Platt and assigned to the present assignee, teaches a pair of pull-down current sources, one on each side of the pull-down inverter for controlling both the high-to-low slew rate and the low-to-high slew rate. Twin reference voltages for the two current sources are provided by a current mirror circuit. In one embodiment Platt discloses both the pull-down inverter and the pull-up inverter regulated by a single pair of current sources.

SUMMARY

It is an object of this invention to provide an improved output circuit for an IC chip.

It is another object of this invention to provide such an output circuit with a lower voltage spike generated by the inductance of the packaging wires.

It is a further object of this invention to reduce the voltage spike without changing the operating speed.

It is another object of this invention to provide a slew control for a low spike output circuit which advances the start of turn-off of the output transistors.

It is a further object of this invention to provide a two stage slew control for the output circuit.

It is a further object of this invention to provide a stage slew control with sizing flexibility.

Briefly, these and other objects of the present invention are accomplished by providing an output circuit for an IC chip having a two stage slew control for reducing di/dt in the output current. An inverter or slew means has an input node and a slew node, and is responsive to input signals on the input node for controlling a slew voltage on the slew node. The slew means also has a power supply node for electrical connection to one terminal of a power supply, and a current node for connection to the other terminal of the power supply. The output transistors control the output current of the output circuit by means of a low impedance state and a high impedance state. The switching state of the output transistors respond to the slew voltage on the slew node. A first slew control stage provides an initial low impedance current path for conducting high current levels between the slew node and the other terminal of the power supply to rapidly slew the slew voltage on the slew node during the initial stage of the slew period before the output transistor starts to switch impedance states. A second slew control stage connected between the current node and the other terminal of the power supply, provides a high impedance current path for conducting low current levels between the slew node and the other terminal of the power supply to slowly slew the slew voltage on the slew node during the final stage of the slew period when the output transistor is switching impedance states.

BRIEF DESCRIPTION OF THE DRAWING

Further objects and advantages of the present output circuit and the operation of the two stage slew control will become apparent from the following detailed description and drawing in which.

GENERAL EMBODIMENT (FIG. 1)

Figure 1:
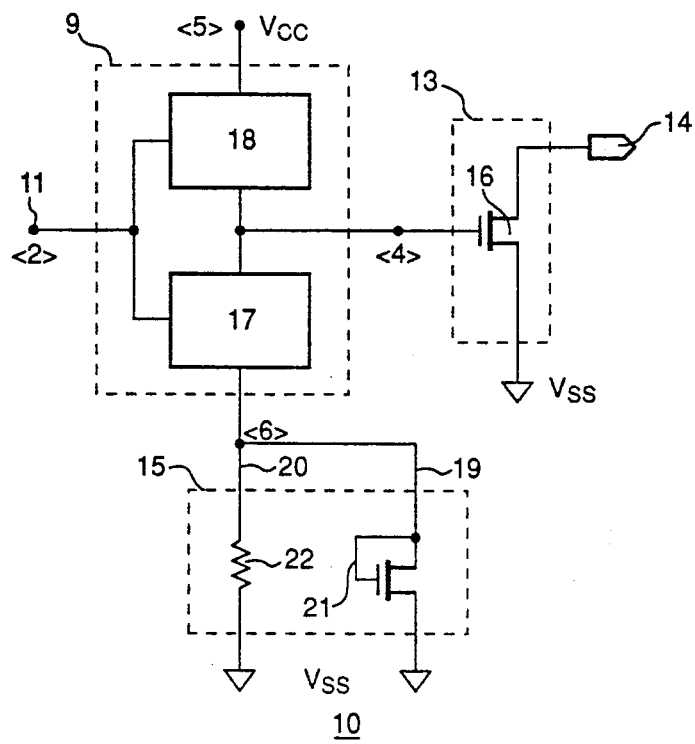
FIG. 1 is a schematic-block diagram of a general embodiment of the output circuit.

A general embodiment 10 is formed by an input lead 11 for receiving internal signal transitions, an output section 13 connected to output pad 14, a slew section 9 connected to the input section at input node <2> and connected to the output section at slew node <4>, and a two stage slew control section 15 connected to slew section 9 at current node <6>.

Output section 13 may include any suitable multistate switching device such as output transistor 16 connected to output pad 14. The gate of output transistor 16 is connected to slew node <4>.

Slew section 9 may include any suitable flip-flop or inverter type logic device having two opposed stable states such as a pair of switches 17 and 18 connected on either side of slew node <4>. Switch 17 is responsive to low-to-high input transitions on input node <2> for providing a low impedance path between the gate of transistor 16 (slew node <4>) and slew rate control 15 (current node <6>). The opposite transitions (high-to-low) cause a high impedance in the node <4> to node <6> path. The other switch 18 in slew section 9 is responsive to high-to-low input transitions for providing a low impedance path between node <4> and one terminal of the power supply (Vcc rail) at power supply node <5>. The opposite transitions (low-to-high) cause a high impedance in the node <4> to node <5> path.

Slew control section 15 provides a fast slew path 19 and slow slew path 20 for discharging slew node <4> into the other terminal of the power supply (Vss or ground). The capacitance of node <4> is primarily the control gate structure of output transistor 16. Node <4> must be discharged in order for the gate to change the conductive state of output transistor 16. Fast slew path 19 contains a suitable switching device such as transistor 21 which provides a temporary low impedance path for conducting high current levels between node <4> and the other terminal of the power supply, thereby rapidly discharging node <4> during the initial stage of the slew period. Slow slew path 20 contains a suitable impedance device such as resistor 22 for conducting low current levels and slowly discharging node <4> during the final stage of the slew period. The inductive spike voltage is generated in the packaging wires leading from internal node Vss to the system printed circuit board during the final stage of the slew period while the output transistor is turning off. The slow slew extends the turn-off time over a longer "dt" resulting in a lower di/dt spike.

OPERATION OF GENERAL EMBODIMENT (FIGS. 2A–2B)

Figure 2A:
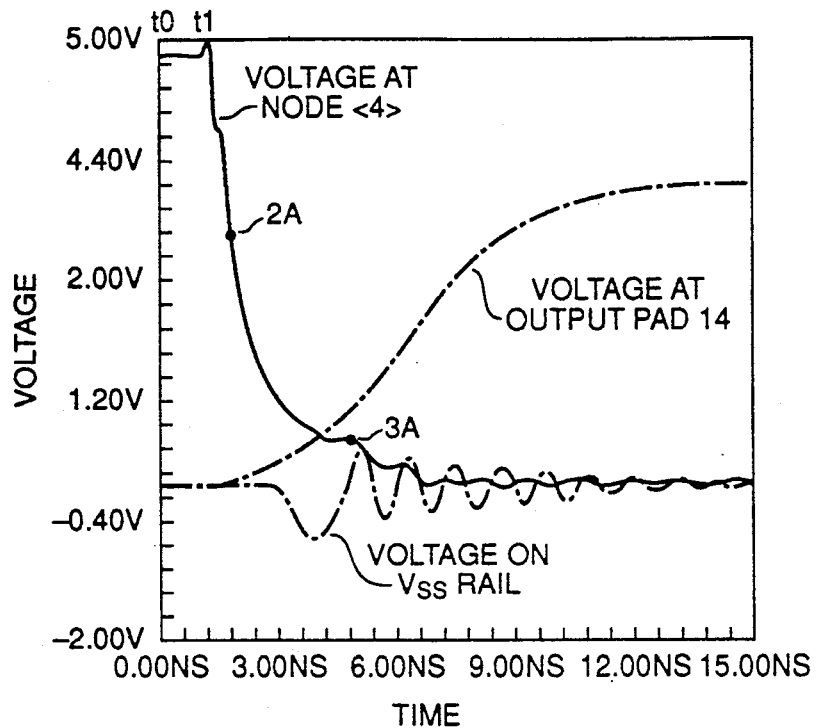
FIG. 2A is a graph of voltage against time for certain nodes within the output circuit showing reduced di/dt as the pull-down transistor switches from on to off.

The operation will be described making reference to the circuit shown in FIG. 1 together with the graphs of FIGS. 2A and 2B. Prior to time t0 (see FIG. 2A) embodiment 10 is in the signal low mode and has the following operational status:
the signal at input lead 11 is low,
input node <2> is low,
slew switch 17 is off (high impedance),
slew switch 18 is on (low impedance),
slew node <4> is high,
output transistor 16 is on causing output pad 14 to be low (at Vss or ground).
current node <6> is low, and
fast slew transistor 21 is off (no fast slew discharge current).

At time t0 (see FIG. 2A) the input signal changes from low to high (a low-to-high transition), and slew section 9 starts to flip into the opposite stable state.

At time t1 the flip is complete. Slew switch 18 is turned off isolating node <4> from Vcc, and slew switch 17 is turned on raising current node <6> to the high voltage at slew node <4>. The control gate of transistor 21, with threshold voltage Vt(fast), is thus connected to node <4>, which causes transistor 21 to turn on and remain on as long as node <4> exceeds the transistor's threshold voltage. Node <4> begins the initial stage discharge through both fast slew path 19 and slow slew path 20. Node <6> voltage rapidly drops to a level near Vt(fast). The stage one fast discharge is shown in FIG. 2A (see initial steep slope stage of node <4> curve) between time t1 and time t2A.

At time t2A fast slew transistor 21 starts to turn off because of insufficient gate to source voltage, reducing the discharge rate of node <6>. Slow slew resistor 22 continues to discharge node <4> at a lower rate. The final stage slow slew discharge is shown in FIG. 2A (final low slope stage of node <4> curve) between time t2A and time t3A. Output transistor 16 starts to turn-off at about time t2A, and continues to gradually turn off during the extended final low slope stage as node <4> drops through the threshold voltage Vt(out) required to keep the output transistor on. The inductive spike in the output current and ringing on Vss start at time t2A when the first di/dt develops. The inductive spike rings on the Vss rail because of the resonance between the packaging wire inductance (about 15 nhenries) and the capacitance of Vss (several mfarads).

At time t3A, output transistor 16 is completely off. The output switch turn-off time extends from time t2A to time t3A, which is about 3 nsec. Assuming the previous typical conditions, the induced voltage spike is:

$$\begin{aligned} \text{Vspike} &= L\,(di/dt) \\ &= 15 \text{ nhenries } (128 \text{ microamp}/3 \text{ nsec}) \\ &= .640 \text{ volts.} \end{aligned}$$

Figure 2B:
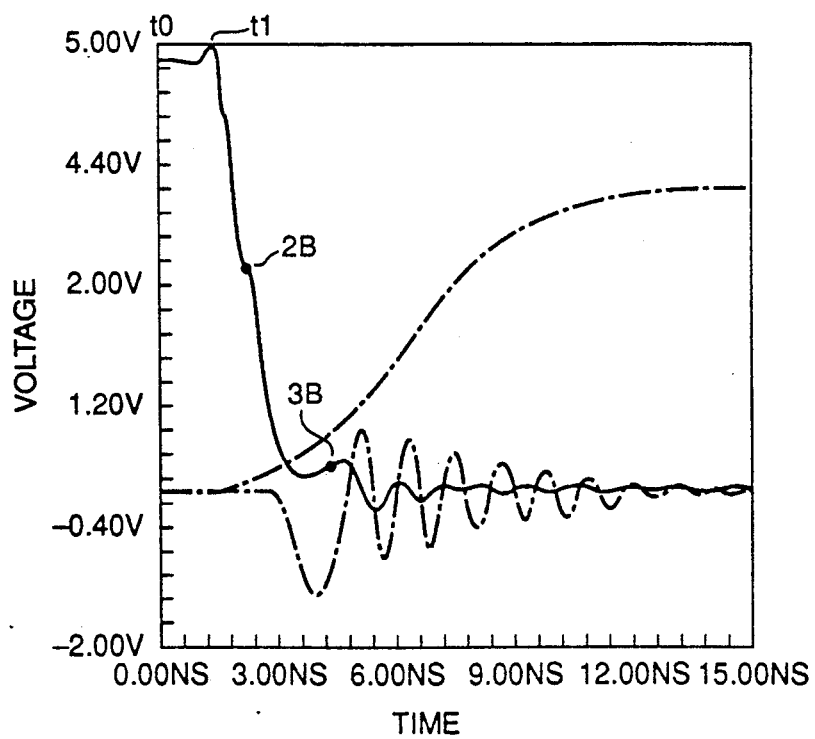
FIG. 2B is a graph of voltage against time for certain nodes without the reduced di/dt of FIG. 2A.

For comparison purposes, FIG. 2B shows slew node <4> voltage decline through slow slew path 20 only without the benefit of fast slew path 19. Node <4> starts to drop at time t1, and follows an almost straight line (single slope) at the slow discharge rate. When node <4> reaches Vt(out) at time t2B, the output transistor starts to turn off. At time t3B the transistor is completely off. The output switch turn-off time extends from time t2B to time t3B, a switching time of about 1.5 nsec. Under the typical conditions, the voltage spike would be 1.28 volts.

The fast slew path advances the start of turn-off for the output transistor toward the beginning of the slew period. The initial pre Vt time interval between time t1 and time t2B (see FIG. 2B) is shortened to the time interval between time t1 to time t2A (see FIG. 2A).

DOUBLE SLOW SLEW PATH EMBODIMENT (FIG. 3)

Figure 3:
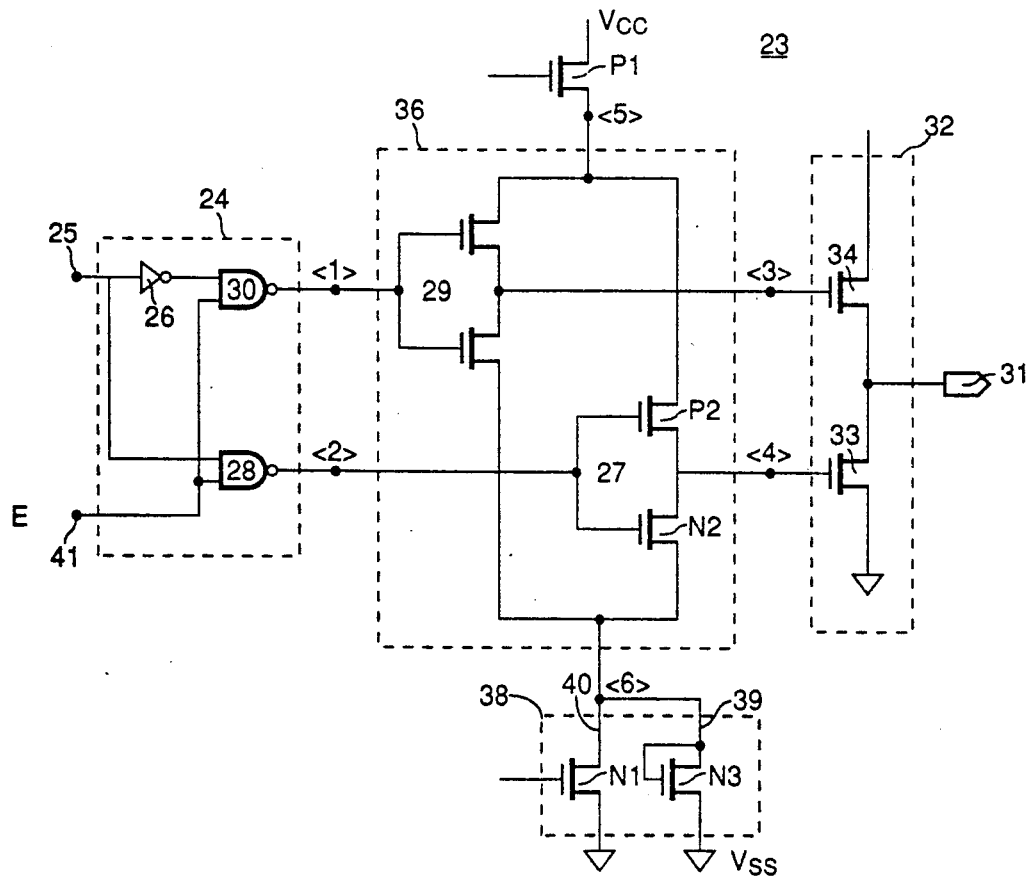
FIG. 3 is a schematic-block diagram of a double slow slew path embodiment of the output circuit.

A double slow slew path embodiment 23 (see FIG. 3) is similar to the general embodiment 10 with an additional slow slew path connected to Vcc. Input section 24 may be any suitable circuitry such as input lead 25 and data inverter 26. The data transitions at input lead 25 are applied through enable gate 28 of input section 24 to pull-down inverter 27. The data transitions are inverted by data inverter 26 and then applied to pull-up inverter 29 through enable gate 30 of input section 24. Enable gates 28 and 30 provide a tri-state or "floating" condition for output pad 31.

Output section 32 includes pull-down output switch 33 and pull-up output switch 34. The output switches shown in the FIG. 3 embodiment are N-channel MOS transistors with a common node for the drain of transistor 33 and the source of transistor 34 and output pad 31. The output transistors have their control gates connected to pull-down slew node <4> and pull-up slew node <3> respectively. During normal bistate operation, the output switches are in opposite conductive states and the output pad is either pulled down to Vss or pulled up to Vcc.

Pull-down slew section 36 is comprised of pull-down inverter 27 for controlling the gate of output switch 33 and pull-up inverter 29 for controlling the gate of output switch 34. Pull-down inverter 27 in the preferred embodiment is a CMOS inverter having an N-channel high-to-low transistor N2 and a P-channel low-to-high transistor P2 with a common drain therebetween connected to pull-down slew node <4>. The gates of N2 and P2 are controlled by input node <2> at the output of enable gate 28. Because N2 and P2 have the opposite channel polarity, they respond oppositely to voltages at the output of enable gate 28 (node <2>), and always in the opposite conductive states. When node <2> changes from high to low, P2 turns on and N2 turns off. Likewise when node <2> changes from low to high, P2 turns off and N2 turns on. Pull-up invertor 29 is similar to pull-down inverter 27 in construction and operation. The common drains of transistor invertor 29 are connected to pull-up slew node <3> for controlling pull-up transistor 34. The gates of these transistors are connected to input node <1> at the output of enable gate 30.

Slew control section 38 is connected to both inverters 27 and 29 at node <6> for controlling the turn off time of output transistor 33 during pull-up and the turn off time of output transistor 34 during pull-down. The slew control section has fast slew path 39 with N-channel transistor N3 which is switched on during output pull-up by the initially high voltage at pull-down slew <4> when transistor N2 becomes conductive as pull-down inverter 27 flips in response to low-to-high transitions at input node <2>. Transistor N3 conducts and rapidly drops the slew voltage at node <4> and turns off as the voltage at node <4> drops to the threshold voltage Vt(fast) of transistor N3; discharge stage begins.

The threshold voltage Vt(out) of output pull-down transistor 33 is equal to or slightly less than the Vt(fast), causing the output transistor 33 to start to turn off at about the same time that fast slew transistor N3 turns off. The initial fast slew advances the start of turn off of pull-down transistor 33.

Slew control section 38 also has slow slew path 40 with a suitable constant current device such as N-channel transistor N1. Slow slew current source N1 is preferably conductive at a high impedance level throughout both the initial stage and the final stage of the slew down period. Device N1 is controlled by a reference voltage applied at the control electrode to provide a generally constant current, the value of which can be modified, if desired, by changing the reference voltage. The slow discharge current level is determined by the W/L ratio (width over length sizing) of the control gate channel, and is low in order to extend the slew stage beyond the switching time of output transistor 33. The low discharge current permits output transistor 33 to turn off gradually over a longer time thus reducing di/dt of the decreasing output current.

Supply Vcc is coupled through constant current transistor P1, a P-channel transistor having a drain connected through node <5> to both inverters 27 and 29 for controlling the turn on time of output transistor 33 during pull-down and the turn on time of output transistor 34 during pull-up. Transistor P1 has a high impedance state determined by W/L sizing for maintaining a low discharge current which extends the slew period as either output transistor 33 or 34 turns on. Transistor P1 is controlled by a reference voltage applied at the control electrode to provide a generally constant current, the value of which can be modified, if desired, by changing the reference voltage. Transistor P1 delays the start of turn on to prevent "crowbar" current in the output circuit caused by simultaneous conduction in both output transistors. The low current through P1 also prolongs the turn on time for reducing di/dt of the increasing current through the output transistor being turned on.

TRISTATE OPERATION (FIG. 3)

Output enable signal OE at input lead 41 is applied to the enable input of enable gates 28 and 30. During bistate operation which is the normal mode, OE is high causing the outputs of both enable gates to be controlled by the input data from input lead 25 which appears at the data input to each gate. Because of data inverter 26, the data inputs to the two enable gates always have opposite high/low states. Therefore during bistate operation, the output of the enable gates (at node <2> and node <1>) are also opposite and the inverters 27 and 29 have opposite conductive states. Slew nodes <4> and <3> are therefore opposite and the output transistors have opposite conductive states. Either the pull-down transistor is on and the pull-up transistor is off, or the reverse. In bistate operation the input data determines whether the output pad is pulled up or pulled down by the output transistors.

The tri-state floating output occurs when OE goes low, causing both input nodes <2> and <1> to go high at the same time irrespective of the data inputs. Both slew nodes then go low turning off both output transistors 33 and 34, and the output pad is neither pulled-up (high) or pulled-down (low).

FOUR CURRENT SOURCE EMBODIMENT (FIG. 4)

Figure 4:
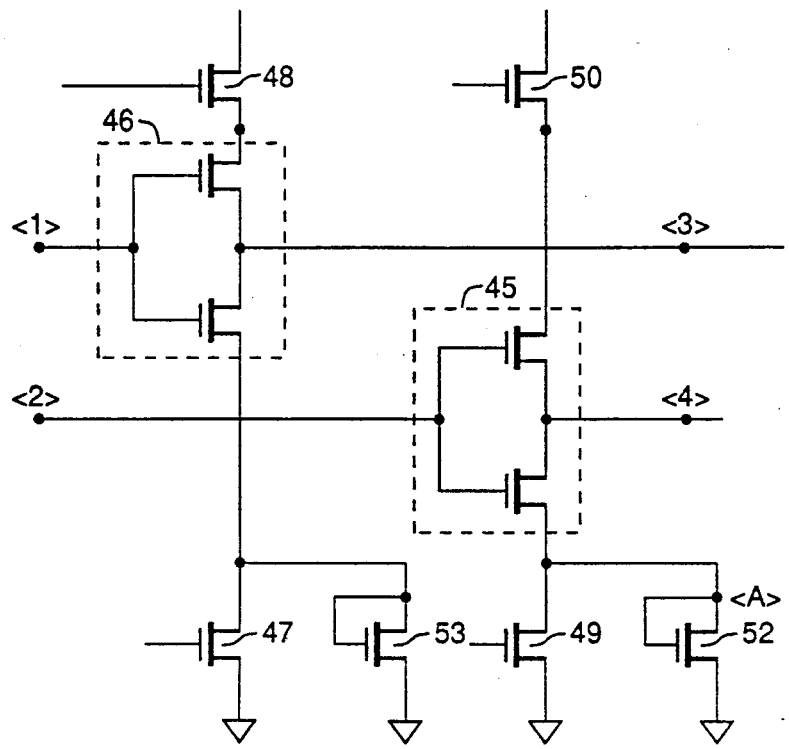
FIG. 4 is a schematic-block diagram of a four current source embodiment of the output circuit.

A four current source embodiment 44 (see FIG. 4) has a separate N1 transistor and P1 transistor for each inverter 45 and 46 for enhancing sizing flexibility in the circuit design and electrically isolating the pull-down portion from the pull-up portion. The slow slew charge and discharge currents through each of the four current source transistors 47, 48, 49, and 50 may be independently determined. In addition each inverter has a separate fast slew transistor. Fast slew transistor 52 is connected in parallel with slow slew transistor 49 for controlling the turn off of the pull-down output transistor. The other fast slew transistor 53 is connected in parallel with slow slew transistor 47 for controlling the turn off of the pull-up output transistor. This embodiment could be used, for example, with input section 24 and output section 32 illustrated in FIG. 3. Transistors 47, 48, 49 and 50 normally function as constant current devices, where the specific current level can be selected or modified by means of a reference voltage applied at the control electrode of each transistor. This reference voltage could be different for each transistor, but preferably would be identical for transistors 48 and 50 and identical for transistors 47 and 49.

GATED FAST SLEW EMBODIMENT (FIG. 5)

Figure 5:
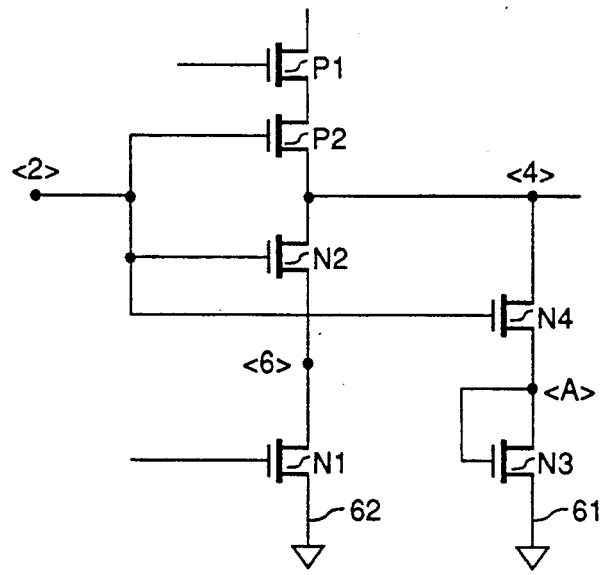
FIG. 5 is a schematic diagram of a gated fast slew path embodiment of the output circuit.

A gated fast slew embodiment 60 (see FIG. 5) has two transistors in fast slew path 61, a fast slew transistor N3 and a gating transistor N4. The transistors have a common node <A> therebetween which also connects to the control gate for N3. The control gate of gating transistor N4 is connected to pull-down input node <2> and is turned on and off the same as inverter transistor N2. Transistor N4 isolates switching transistor N3 from slow slew path 62 and permits sizing flexibility in the design of both N3 and N4. A similar gated fast slew path may be used in the pull-up circuit for advancing the start of turn off of the pull-up output transistor.

INDUSTRIAL APPLICABILITY

It will be apparent to those skilled in the art that the objects of this invention have been achieved by providing a two stage slew circuit. The fast stage of the slew circuit advances the start of turn off for the output transistors. The slow stage of the slew circuit prolongs the turn off time of the output transistors, thereby reducing di/dt and the associated voltage spike generated by the inductance of the packaging wires. The sizing of the circuit transistors permits the overall operating speed to remain the same in spite of the earlier onset of turn off and lower noise of the slew circuit of this invention.

CONCLUSION

Clearly various changes may be made in the structure and embodiments shown herein without departing from the concept of the invention. For example, in a CMOS circuit the function and position of the N-channel devices and P-channel devices could be reversed. A slew up circuit could be provided to reduce voltage spikes associated with output driver turn on, analogous to the turn off control described herein. Further, features of the embodiments shown in the various Figures may be employed with the embodiments of the other Figures. For example, the gated fast slew circuit of FIG. 5 could be employed in the four current source embodiment of FIG. 4.

Therefore, the scope of the invention is to be determined by the terminology of the following claims and the legal equivalents thereof.

I claim as my invention;

1. An output circuit for an IC chip having a two stage slew control for reducing di/dt in the output current thereof, comprising:

slew means having an input node and a slew node, the slew means responsive to input signals on the input node for controlling a slew voltage on the slew node, the slew means also having a power supply node for electrical connection to one terminal of a power supply, and having a current node for connection to the other terminal of the power supply;

output switch means connected to said slew node for controlling the output current of an output circuit, having a low impedance state and a high impedance state, and responsive to the slew voltage on the slew node for switching between said low and high impedance states;

a first slew control stage connected between said current node and said other terminal of the power supply, providing an initial low impedance path for conducting high current levels between the slew node and the other terminal of the power supply to rapidly slew the slew voltage on the slew node during an initial stage of a slew period before said output switch means starts to switch impedance states in response to the changing slew voltage; and a second slew control stage connected between said current node and said other terminal of the power supply, for providing a high impedance path for conducting low current levels between the slew node and the other terminal of the power supply during said initial stage and to slowly slew the slew voltage on the slew node during the final stage of the slew period when the output switch means is switching impedance states.

2. The output circuit of claim 1, wherein the first slew control stage is a slew control switching means having a low impedance state for providing the initial low impedance path during the initial stage of the slew period, and a high impedance state during the final stage of the slew period.

3. The output circuit of claim 2, wherein said slew control switching means includes a control means responsive to the slew voltage on the slew node for changing impedance states.

4. The output circuit of claim 3, wherein said slew control switching means is responsive to said slew voltage for providing the initial low impedance path when the slew voltage is greater than the threshold voltage Vt(fast) of the slew control switching means, and responsive to the slew voltage for providing said high impedance path when the slew voltage is less than Vt(fast).

5. The output circuit of claim 4, wherein said output switch means has threshold voltage Vt(out) and is in the high impedance state when the slew voltage is less than Vt(out), and in said low impedance state when the slew voltage is greater than Vt(out).

6. The output circuit of claim 5, wherein Vt(out) is slightly less than Vt(fast).

7. The output circuit of claim 5, wherein Vt(out) is substantially equal to Vt(fast).

8. The output circuit of claim 5, wherein said output switch means changes from said low impedance state to said high impedance state during the final stage of the slew period.

9. The output circuit of claim 2, wherein said slew control switching means comprises an MOS transistor having a control electrode and one conduction electrode connected to said current node and the other conduction electrode connected to said other terminal of the power supply for providing the initial low impedance path.

10. The output circuit of claim 2, wherein said slew control switching means comprises an MOS switching transistor and an MOS gating transistor connected in series at a common node therebetween, the switching transistor connected between said common node and said other terminal of the power supply and the gating transistor connected between said slew node and said common node, whereby the switching transistor is isolated from the slew voltage when the slew voltage is high or going high.

11. The output circuit of claim 10, wherein
    said switching transistor has a control electrode and a first conduction electrode connected to said common node and a second conduction electrode connected to said other terminal of the power supply, and wherein said gating transistor has a control electrode for connecting to said input node, a first conduction electrode connected to said slew node and a second conduction electrode connected to said common node.

12. The output circuit of claim 1 wherein, said second slew control stage is an impedance means for providing said high impedance path between said current node and said other terminal of the power supply.

13. The output circuit of claim 12 wherein, said impedance means is a resistor.

14. The output circuit of claim 12 wherein said impedance means is a constant current source for defining low current level through the high impedance path.

15. The output circuit of claim 14 wherein said constant current source is an MOS transistor.

16. The output circuit of claim 14 wherein the constant said current source conducts the low current level during said initial and final stages of the slew period.

17. The output circuit of claim 16 further comprising a reference voltage applied to the control electrode of said constant current source MOS transistor.

18. The output circuit of claim 1, wherein said slew means comprises a first switching means connected between said input node, said power supply node and said slew node and a second switching means connected between said input node, said current node and said slew node for providing a low impedance between the slew node and the current node and a high impedance between the slew node and the power supply node in response to a first input state, and for providing a high impedance between the slew node and the current node and a low impedance between the slew node and the power supply node in response to a second input state.

19. An output circuit for an IC chip having an output pad and a slew control for reducing di/dt in the output current at the output pad of the chip, comprising:

input means for receiving input signals to the output circuit;

pull-down inverter means having an input node electrically connected to said input means and having a pulldown slew node, and responsive to the input signals for controlling a slew voltage on the pull-down slew node;

pull-up inverter means having an input node electrically connected to said input means and having a pull-up slew node, and responsive to the input signals for controlling a slew voltage on the pull-up slew node;

a high node connected to each of the inverter means for electrical connection to the high side of a power supply;

a low node connected to each of the inverter means for connection to the low side of the power supply;

an output pull-down transistor connected to the output pad, the low side of the power supply, and the pull-down slew node and having an on state and an off state, and responsive to the slew voltage on the pull-down slew node for changing states;

an output pull-up transistor connected to the output pad, the high side of the power supply, and the pull-up slew node and having an on state and an off state, and responsive to the slew voltage on the pull-up slew node for changing states;

a first constant current source connected between said low node and the low side of the power supply;

a second constant current source connected between said high node and the high side of the power supply; and a fast slew control means providing an initial low impedance current path for conducting high current levels between either of said slew nodes and said low side of the power supply to rapidly slew the slew voltage during the initial stage of the slew period before the output transistors start to change states in response to the changing slew voltages.

20. The output circuit of claim 19, wherein said fast slew control means is a single MOS transistor having a control electrode and one conduction electrode connected to said low node, and the other conduction electrode connected to said low side of the power supply.

21. The output circuit of claim 19, wherein the input means further comprises:

a data node for receiving input data signals;

an enable node for receiving input enable signals;

a data inverter;

a pull-down gate having a data input connected to the data node and an enable input connected to the enable node, and an output connected to the input node of said pull-down inverter means; and a pull-up gate having a data input connected through said data inverter to the data node and an enable input connected to the enable node, and an output connected to the input node of the pull-up inverter means.

22. The output circuit of claim 19, wherein said first constant current source is a first transistor with a first reference voltage applied to the control electrode thereof, and said second constant current source is a second transistor with a second reference voltage applied to the control electrode thereof.

23. An output circuit for an IC chip having an output pad and a slew control for reducing di/dt in the output current at the output pad of the chip, comprising:

pull-down inverter means having an input node and a pull down slew node, and responsive to input signals on the input node for controlling a slew voltage on the pull-down slew node, the pull-down inverter means having a low node for electrical connection to the low side of a power supply and a high node for electrical connection to the high side of the power supply;

pull-up inverter means having an input node and a pull-up slew node, and responsive to input signals on the input node for controlling a slew voltage on the pull-up slew node, the pull-up inverter means having a low node for electrical connection to the low side of the power supply and a high node for electrical connection to the high side of the power supply;

an output pull-down transistor connected to the output pad, the low side of the power supply and the pull-down slew node, and having an on state and an off state, and responsive to the slew voltage on the pull-down slew node for changing states;

an output pull-up transistor connected to the output pad, the high side of the power supply and the pull-up slew node and having an on state and an off state, and responsive to the slew voltage on the pull-up slew node for changing states;

a first low constant current source connected between the low node of the pull-down inverter means and the low side of the power supply;

a second low constant current source connected between the low node of the pull-up inverter means and the low side of the power supply;

a first high constant current source connected between the high node of the pull-down inverter means and the high side of the power supply;

a second high constant current source connected between the high node of the pull-up inverter means and the high side of the power supply; and a first slew control means connected between the low node of the pull-down inverter means and the low side of the power supply and providing an initial low impedance current path for conducting high current levels between the pull-down slew node and the low side of the power supply to rapidly slew the slew voltage on the pull-down slew node during the initial stage of the pull-down slew period before the output pull-down transistor start to change from the on to the off state in response to the changing slew voltage.

24. The output circuit of claim 23, wherein said first slew control switching means is a single MOS transistor having a control electrode and one conduction electrode connected to the low node of said pull-down inverter means and the other conduction electrode connected to the low side of the power supply.

25. The output circuit of claim 23, wherein said first slew control switching means comprises an MOS switching transistor and an MOS gating transistor connected in series at a common node therebetween, the gating transistor connected between the pull-down slew node and the common node.

26. The output circuit of claim 25, wherein said switching transistor has a control electrode and a first conduction electrode connected to said common node and a second conduction electrode connected to said common node and a second conduction electrode connected to said low side of said power supply, and wherein the gating transistor has a control electrode connected to said input node of said pull-down inverter and a first conduction electrode connected to the pull-down slew node and a second conduction electrode connected to the common node.

27. The output circuit of claim 23, further comprising:

a second slew control means connected between the low node of said pull-up inverter means and said low side of the power supply and providing an initial low impedance current path for conducting high current levels between the pull-up slew node and the low side of the power supply to rapidly slew the slew voltage on the pull-up slew node during the initial stage of a pull-up slew period after a change in the input to the pull-up inverter means and before the output pull-up transistor starts to change from the on to the off state.

* * * * *